United States Patent [19]
Oldfield

[11] Patent Number: 5,905,421
[45] Date of Patent: May 18, 1999

[54] APPARATUS FOR MEASURING AND/OR INJECTING HIGH FREQUENCY SIGNALS IN INTEGRATED SYSTEMS

[75] Inventor: William Oldfield, Redwood City, Calif.

[73] Assignee: Wiltron Company, Morgan Hill, Calif.

[21] Appl. No.: 08/800,952

[22] Filed: Feb. 18, 1997

[51] Int. Cl.[6] .................................................. G01R 31/28
[52] U.S. Cl. .......................... 333/245; 333/33; 324/758
[58] Field of Search ............................ 333/33, 245, 246; 324/758

[56] References Cited

U.S. PATENT DOCUMENTS

| | | | |
|---|---|---|---|
| 4,697,143 | 9/1987 | Lockwood et al. | 333/246 X |
| 5,477,137 | 12/1995 | Staudinger et al. | 333/246 X |

OTHER PUBLICATIONS

Adams, "Microstrip," Radio–Electronic Engineering, p. 14, Apr. 1954.

Liao, "Microwave Devices And Circuits," p. 422 Prentice-–Hall, Englewood Cliffs, NJ, 1980.

Kornowski, "The K–50L Coaxial Probe: Its Origin, Applications, and Benefits," 45th ARFTG Conference Digest, May 19, 1995, pp. 46–55.

*Primary Examiner*—Robert Pascal
*Assistant Examiner*—Justin P. Bettendorf
*Attorney, Agent, or Firm*—Fliesler, Dubb, Meyer & Lovejoy LLP

[57] ABSTRACT

A device for measuring and/or injecting a high frequency signal, such as a 20 GHz signal from and/or into a system, is provided. The device includes a connector coupled to a coaxial cable at one end. A relatively small, low inductive rectangular member is coupled to the connector at the other end. A conductive element is coupled to the rectangular member and is used for measuring and infecting the high frequency signal from and/or into a microwave transmission line positioned on a substrate. First and second rigid prongs are coupled to the rectangular member and are inserted into respective ground openings on the substrate. A network analyzer may be coupled to the cable for analyzing and generating the high frequency signal.

15 Claims, 5 Drawing Sheets

APPARATUS FOR MEASURING AND/OR INJECTING HIGH FREQUENCY SIGNALS IN INTEGRATED SYSTEMS

BACKGROUND OF THE INVENTION

1. Field of the Invention

The present invention relates to measuring signals in systems, and in particular, measuring high frequency signals in integrated systems.

2. Description of the Related Art

A major problem in testing integrated high frequency systems such as radar systems, test equipment systems and the like, is isolating defective or substandard circuits. Typically, an integrated high frequency system may consist of between approximately 30 and 40 circuits or components. Often, the multiple circuits in these complex high frequency systems may make it difficult to isolate a defective circuit.

However, combining many functions or circuits on one substrate and/or housing in an integrated high frequency system is cost effective and reduces the overall size of the system. Typically, circuits and respective connections to other circuits are formed using traces on a substrate. For example, microwave transmission lines made out of TEFLON fiberglass may be formed on a substrate to electrically connect circuits. As many as 40 circuits may be manufactured on one substrate using the TEFLON fiberglass. For example, switches, filters, amplifiers, matching networks, bias tees, antennas and pads, all may be manufactured onto a single substrate.

Often a high frequency system designer will breadboard each circuit in a respective housing in order to optimize the design. This process is complicated, time consuming and expensive. Housed circuits must be connected by coaxial cables and expensive drivers, then must be designed and manufactured for each circuit. A typical test assembly of circuits, housings, drivers and cables used to simulate the integrated high frequency system seldom behaves the same as the final integrated system. The interaction between housed circuits often do not properly simulate the behavior of the final integrated circuits. Also, the connectors and cables between the housed circuits add mismatches that can cause interaction problems between housed circuits that will not be present when the system is integrated.

One proposed solution to measuring high frequency signals in circuits is described in "The K-50L Coaxial Probe: Its Origin, Applications and Benefits," by Robert R. Kornowski, Automatic RF Techniques Group Conference, May 19, 1995 ("Kornowski reference"). The Kornowski reference uses a relatively large "broadband coaxial probe" with multiple telescoping pins to measure "high frequency" signals.

However, the Kornowski reference has many disadvantages. First, the probe does not have a corresponding position on a substrate for mounting and thus may not affix securely to a substrate during measuring. Second, the probe is relatively large, and thus highly inductive, which may reduce the accuracy of measured signals. Third, Kornowski teaches a probe which only measures up to approximately 3 GHz.

Therefore, it is desirable to provide an apparatus for measuring high frequency signals in a system. The apparatus should reduce or eliminate the previous costly and complex testing process requiring separate housings, cables, and drivers. The apparatus should be easy to use and accurately Measure high frequency signals from integrated circuits. The apparatus should also not require complex telescoping pins and affix securely to a substrate during measuring. The apparatus should be relatively small in order to reduce inductance which may affect the accuracy of the measured signal. Further, the apparatus should be able to measure a high frequency signal greater than 3 GHz.

SUMMARY OF THE INVENTION

A device for measuring and/or injecting a high frequency signal from and/or into a trace positioned on a substrate is provided. The device does not require complex telescoping pins and securely couples to a substrate which positions microwave circuits transmitting a high frequency signal such as a 20 GHz signal.

According to one aspect of the present invention, a device for measuring and/or injecting a high frequency signal from and/or into a trace positioned on a substrate comprises a connector coupled to a cable. A member is then coupled to the connector and includes a conductive element for coupling to the trace. The conductive element is positioned between a first rigid prong for coupling the substrate ground and a second rigid prong for coupling to the substrate ground.

According to another aspect of the present invention, the substrate includes a first opening for positioning the first prong and a second opening for positioning the second prong.

According to another aspect of the present invention, the high frequency signal is greater than approximately 3 GHz.

According to another aspect of the present invention, the trace is coupled to a microwave circuit positioned on the substrate. The microwave circuit may be a switch, filter, matching network, bias tee, antenna or an equivalent microwave circuit.

According to another aspect of the present invention, the trace is a microstrip transmission line consisting of TEFLON fiberglass.

According to another aspect of the present invention, the member is rectangular and the cable is coupled to a network analyzer.

According to another aspect of the present invention, a low inductance probe for measuring greater than an approximately 3 GHz signal from a microwave transmission line positioned on a substrate having a first and second opening is provided. The probe is relatively small and includes a connector coupled to a coaxial cable. A rectangular member is also connected to a connector by way of cable and includes a conductive element for measuring the signal from the microwave transmission line. A first rigid prong is coupled to the rectangular member for positioning in the first opening and providing a ground. A second rigid prong is coupled to the rectangular member and is for positioning in the second opening and providing a ground.

Other aspects and advantages of the present invention can be seen upon review of the figures, the detailed description, and the claims which follow.

DETAILED DESCRIPTION OF THE INVENTION

Figure 1:
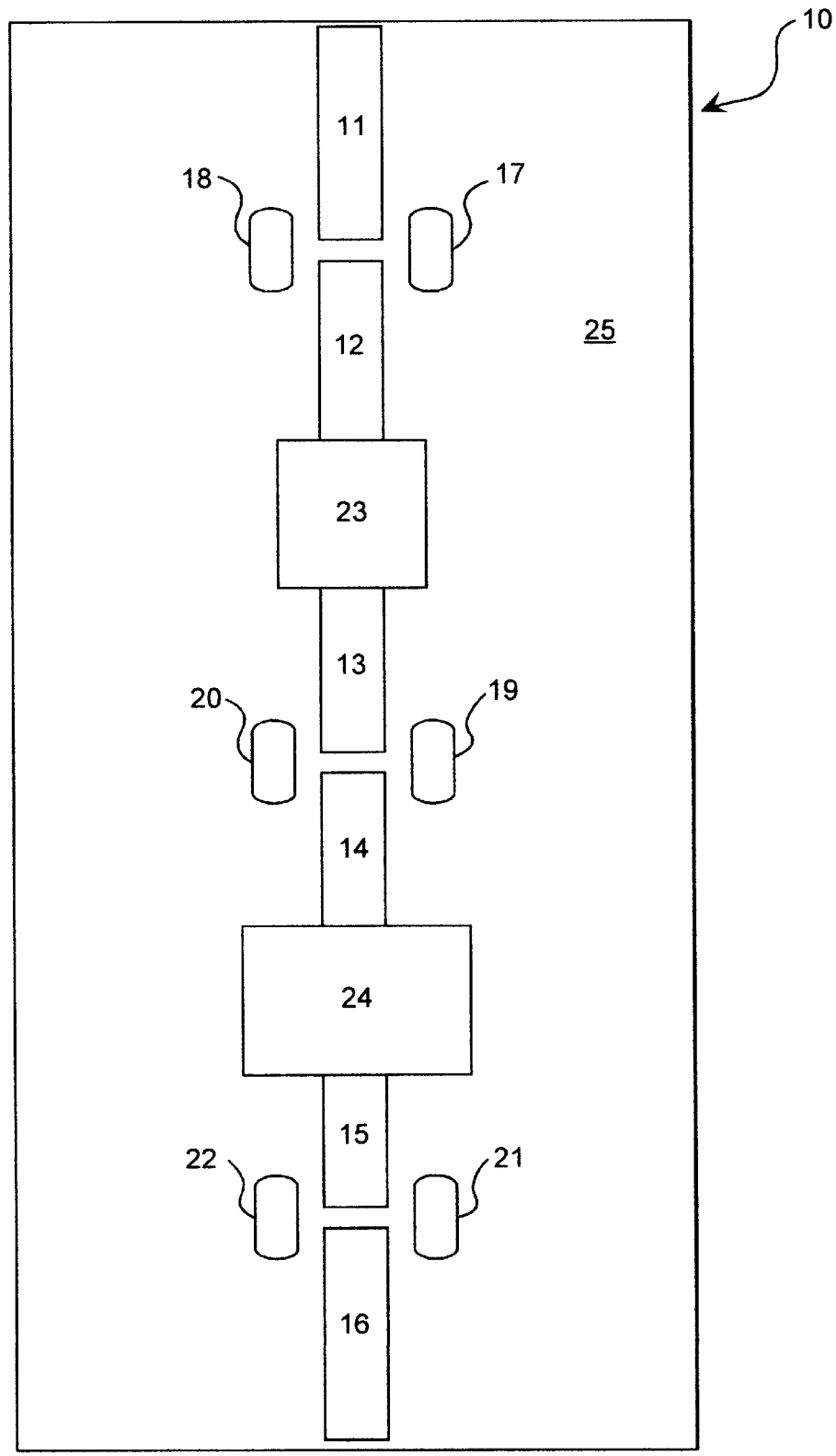
FIG. 1 illustrates circuit block diagrams, traces and mounts formed on a substrate according to the present invention.

FIG. 1 illustrates a portion of a high frequency signal system 10. For clarity only a portion of high frequency system 10 is illustrated. It should be understood by one of ordinary skill in the art that in complex high frequency systems, many circuits are present and only two circuits, microwave circuits 23 and 24, are shown by way of blocks in order to clearly illustrate the invention. In an embodiment, high frequency system 10 may be a portion of a radar system, test equipment system or an equivalent thereof. In an embodiment, circuits 23 and 24 are positioned on substrate 25 and may include microwave circuits, such as an amplifier, antenna, filter, circulator or equivalent.

Typically, in high frequency systems, circuits are coupled by way of traces such as microstrip transmission lines. In an embodiment, microstrip transmission lines 11, 12, 13, 14, 15 and 16 are positioned on substrate 25. Circuit 23 receives and transmits high frequency signals on microstrip transmission line 12 and 13, respectively. Circuit 24 transmits and receives high frequency signals on microstrip transmission line 15 and 14, respectively.

As can be seen in FIG. 1, microstrip transmission lines 11, 12, 13, 14, 15 and 16 are positioned such that gaps are formed between respective transmission lines. Aside each gap includes a mount or pair of openings to a ground plane. For example, openings 18 and 17 are formed aside the gap between microstrip transmission line 11 and microstrip transmission line 12. Openings 18 and 17 are used for coupling the measuring device 62 illustrated in FIG. 3 to a ground plane. Also, openings 20 and 19 are formed on substrate 25 between the gap formed by microstrip transmission lines 13 and 14. Finally, openings 21 and 22 are likewise formed near the gap between microstrip transmission lines 15 and 16.

In an embodiment, microstrip transmission tines 11, 12, 13, 14, 15 and 16 consist of alumina or a high frequency plastic which is able to carry high frequency signals, such as a 40 GHz signal. Typically, the microstrip transmission lines have an impedance of approximately 50 ohms. In other embodiments, microstrip transmission lines 11, 12, 13, 14, 15 and 16 may be made of a high frequency dielectric material, such as TEFLON fiberglass.

Figure 2:
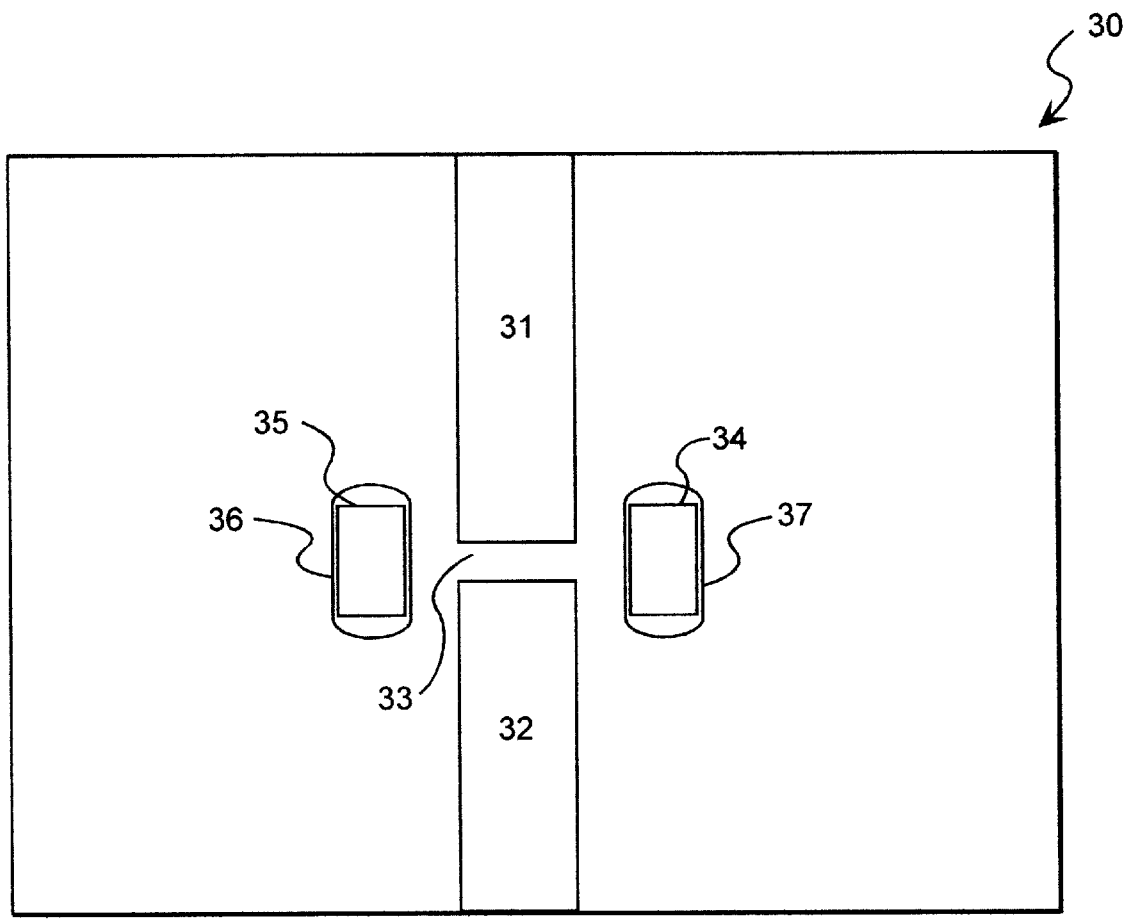
FIG. 2 illustrates a location for positioning a measuring device on the substrate shown in FIG. 1 according to the present invention.
Figure 3:
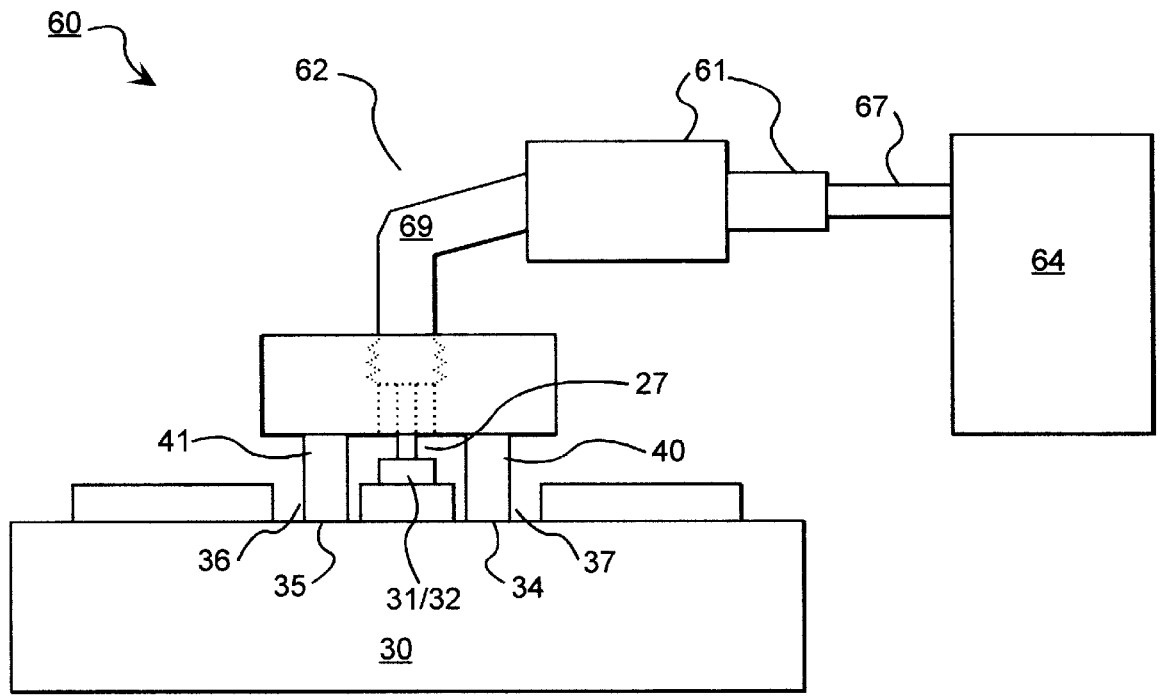
FIG. 3 illustrates a high frequency signal measuring apparatus according to the present invention.

FIG. 2 illustrates an expanded view of the location on the substrate used for affixing measuring and/or infecting apparatus 60 as shown in FIG. 3. Microstrip transmission lines 31 and 32 are separated by a gap 33 on substrate 30. In an embodiment, microstrip transmission lines 31 and 32 have a width of between approximately 0.02 and 0.05 inches. Openings 36 and 37 are used for coupling the measuring device to a ground plane. In an embodiment, openings 36 and 37 are rectangular with curved corners, having dimensions of approximately 0.015 by 0.035 inches. In an embodiment, openings 36 and 37 are formed by milling holes to a substrate ground plane. In an alternate embodiment, openings 36 and 37 may be a different shape or size in order to couple to prong ends 35 and 34 of prongs 41 and 40 as seen in FIG. 3. The location on substrate 30 illustrated in FIG. 2 is relatively small. In an embodiment, the area used for affixing measuring and/or injecting apparatus 60 is less than approximately 0.125 square inch.

FIG. 3 illustrates a measuring and/or injecting apparatus 60 used for measuring and/or injecting high frequency signals on integrated circuits. Apparatus 60 is able to measure high frequency signals in systems having densely packed integrated circuits. Likewise, apparatus 60 injects high frequency signals into a system for testing. The apparatus does not require dismantling of an existing circuit in order to measure or test particular circuits or components. The apparatus accurately and easily measures signals as high as approximately 40 GHz. The apparatus is securely coupled to a substrate during measuring and is relatively inexpensive to manufacture and maintain.

Apparatus 60 includes measuring and/or injecting device 62, network analyzer 64 and substrate 30 having associated traces and openings. Measuring and/or injecting device 62 includes a coaxial connector 61, coaxial cables 67 and 69, a member 63, prongs 40 and 41 and conductive element 27. Prongs 40 and 41 have respective ends 34 and 35. Connector 61 is coupled to a coaxial cable 67 and coaxial cable 69. In an embodiment, coaxial cable 67 is coupled to a network analyzer 64 and coaxial cable 69 is coupled to rectangular member 63.

In an embodiment, the dimensions of rectangular member 63 are 0.25 inch by 0.1 inch by 0.1 inch. This size is approximately one-tenth the size of the probe described in the Kornowski reference. This relatively small sized measuring device allows for reduced inductance and thus better high frequency signal quality measurement. In an alternate embodiment, different member sizes are used for different thicknesses of microwave transmission lines. Member 63 is coupled to rigid prongs 40 and 41 which are positioned into openings 37 and 36 as illustrated in FIG. 2, thus allowing rigid prongs 40 and 41, and in particular prong ends 34 and 35, to contact a ground plane. In an embodiment, rectangular member 63 and rigid prongs 41 and 40 are made out of brass or similar conductive material. In an embodiment, prongs 40 and 41 are rectangular, having dimensions of approximately 0.015 by 0.035 inches. In an alternate embodiment, prongs 40 and 41 may be formed into other geometric shapes. For example, rigid prongs 40 and 41 may be designed for Co-planer waveguides ("CPW"). Telescoping pins described in the Kornowski reference which must be replaced or may break are not used. Further, the rigid prongs allow for a secure coupling of the measuring and/or injecting device 62.

Conductive element 27 then is used to electrically couple microwave transmission lines during measuring and/or injecting of high frequency signals. In an embodiment, conductive element 27 is the center conductor in coaxial cable 69. In an embodiment, conductive element 27 may be bent slightly in order to exert a force between the conductive element 27 and microstrip transmission lines during measuring and/or injecting a high frequency signal. In particular, conductive element 27 couples microstrip transmission line 31 to measuring and/or injecting apparatus 62 when prongs 41 and 40 are inserted into openings 36 and 37, respectively, as shown in FIGS. 2 and 3. Measuring device 62 and network analyzer 64 then measures and/or injects high frequency signals on microstrip transmission line 31. If measuring device 62 is rotated 180 degrees, measuring device 62. could inject and/or measure high frequency signals on microstrip transmission line 32. A jumper may be used to connect the microwave transmission lines when testing other components in the system. The gap then may be bonded across when testing of the high frequency system is finalized.

Figure 4:
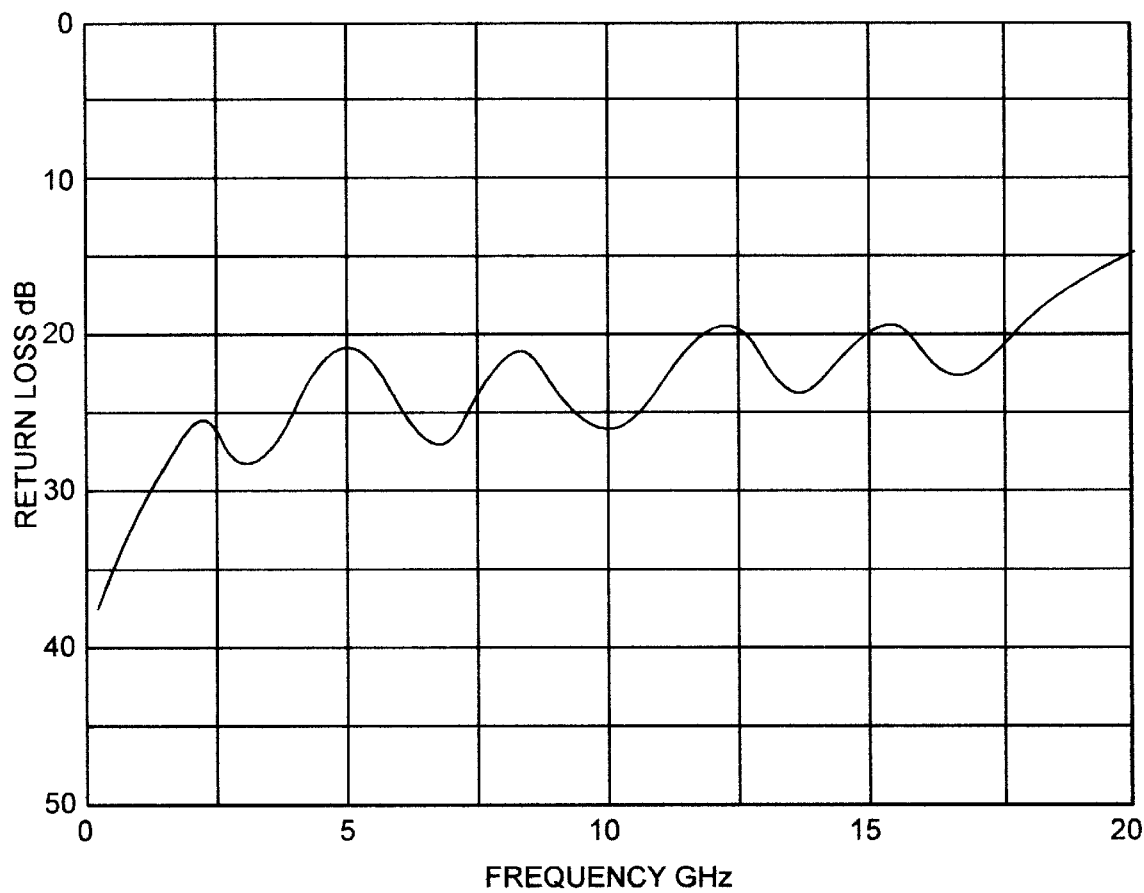
FIG. 4 illustrates a typical uncalibrated high frequency signal using the measuring device shown in FIG. 3.
Figure 5:
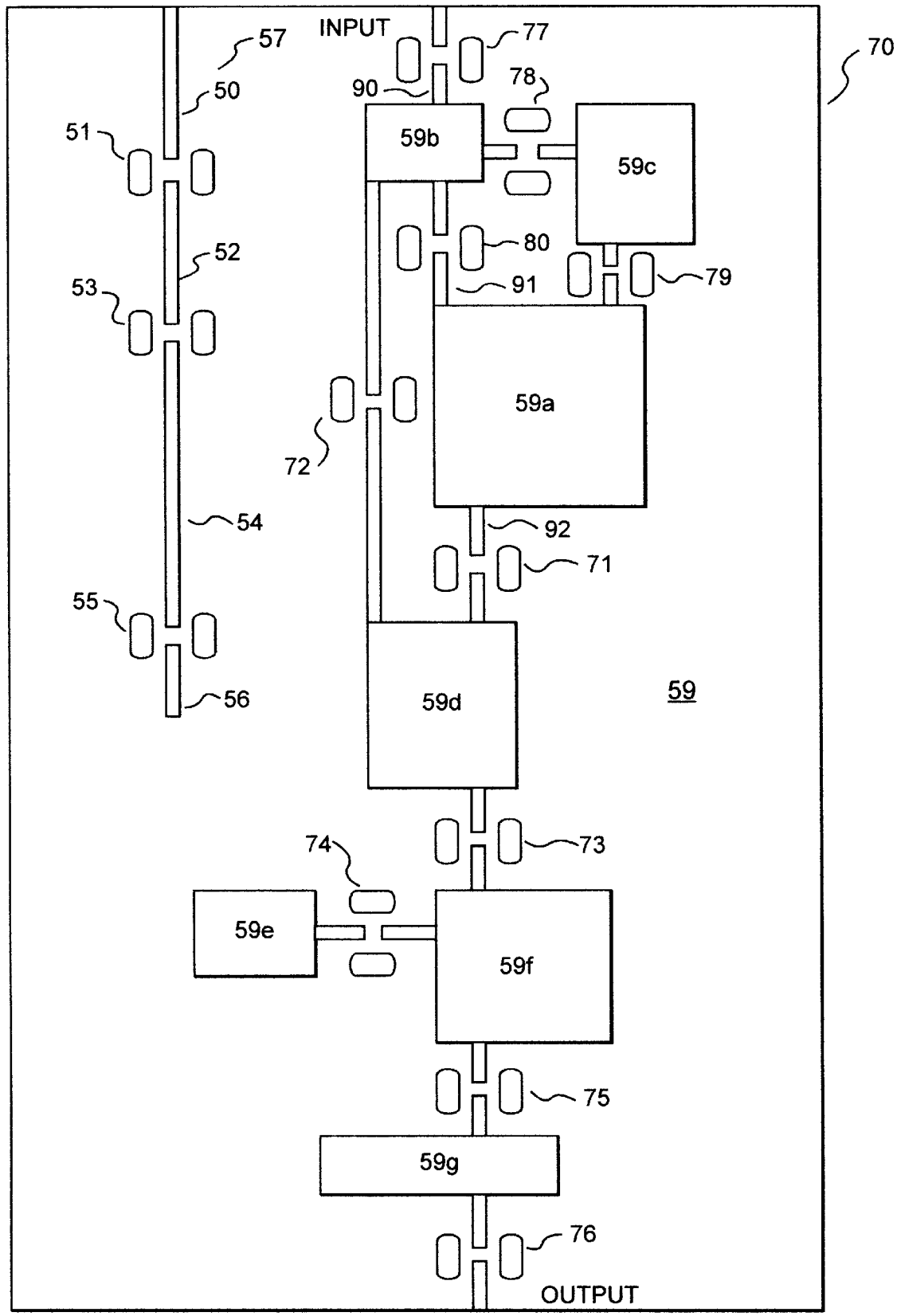
FIG. 5 illustrates a substrate including multiple traces and mounting locations for calibrating the measuring device illustrated in FIG. 3.

FIG. 4 illustrates a typical signal return loss using microstrip transmission line 52 and mounts 51 and 53, as shown in FIG. 5, along with measuring and/or injecting device 62. The primary mismatch is caused by the inductance of the center conductor in coaxial cable 69. Using the measuring and/or injecting apparatus 60 allows for measuring uncalibrated signals up to 20 GHz and calibrated signals up to 40 GHz.

FIG. 5 illustrates calibration portion 57 on substrate 59 in high frequency system 70 used to calibrate measuring and/or injecting apparatus 60. System 70 includes both calibration portion 57 and circuits and traces 59a–g. Adjacent to the various traces are mounts 71 through 80 as illustrated in FIG. 2. These mounts are used to test circuits 59a–h. In an embodiment, three mount locations 51, 53, and 55 are machined in calibration portion 57. In an alternate embodiment, calibration portion 57 may not be on system 70 and may be on a second substrate. Calibration portion 57 includes microstrip transmission lines 50, 52, 54, and 56 along with mount location 51, 53, and 55 for coupling measuring and/or injecting device 62 during measuring and/or injecting of high frequency signals. The first length of microstrip transmission line 52 is arbitrary, typically one centimeter; the length of microstrip transmission line 54 is longer by approximately 0.4 wavelengths of the highest frequency to be measured. This forms the required Line-Reflect-Line ("LRL") lines used in LRL calibration as known by one of ordinary skill in the art. The reflect is formed by disconnecting measuring apparatus 60 from a mount location.

The high frequency system 70 may be tested by positioning measuring and/or injecting device 62 between various circuits, and in particular, in mounts 71–80. For example, an injecting signal may be input into system 70 by positioning measuring and/or injecting device 62 in mount 77. A high frequency signal then may be generated by network analyzer 64 and eventually input into trace 90 and system 70. Likewise, the output signal of system 70 may be measured by positioning measuring and/or injecting device 62 in mount 76. If a particular circuit in system 70 is tested, the measuring and/or injecting device 62 may be positioned at respective inputs or outputs of the circuit to be tested. For example, if circuit 59 is tested, measuring and/or injecting device 62 is coupled to mount 80 and a high frequency signal is generated on trace 91 to circuit 59a. The output of circuit 59a then may be measured by positioning measuring and/or injecting device 62 in mount 71 and measuring the high frequency signal on trace 92.

The foregoing description of the preferred embodiments of the present invention has been provided for the purposes of illustration and description. It is not intended to be exhaustive or to limit the invention to the precise forms disclosed. Obviously, many modifications and variations will be apparent to practitioners skilled in the art. The embodiments were chosen and described in order to best explain the principles of the invention and its practical applications, thereby enabling others skilled in the art to understand the invention for various embodiments and with the various modifications as are suited to the particular use contemplated. It is intended that the scope of the invention be defined by the following claims and their equivalents.

What is claimed is:

1. A device for measuring a high frequency signal from a trace positioned on a substrate having a ground, comprising:
   a) a connector;
   b) a coaxial cable, coupled to the connector, having a center conductor;
   c) a rectangular member having a first side and a second side, coupled to the connector, wherein the center conductor is positioned through an opening on second side between a first rigid prong positioned on the second side for coupling to the substrate ground and a second rigid prong positioned on the second side for coupling to the substrate ground, wherein the center conductor extends from the second side for contacting the trace.

2. The device of claim 1, wherein the substrate includes a first opening for positioning the first prong and a second opening for positioning the second prong.

3. The device of claim 1, wherein the high frequency signal is substantially greater than 3 GHz.

4. The device of claim 1, wherein the trace is coupled to a microwave circuit positioned on the substrate.

5. The device of claim 4, wherein the microwave circuit is a switch.

6. The device of claim 4, wherein the microwave circuit is a filter.

7. The device of claim 4, wherein the microwave circuit is a matching network.

8. The device of claim 4, wherein the microwave circuit is a bias tee.

9. The device of claim 1, wherein the trace is a microstrip transmission line.

10. The device of claim 1, wherein the center conductor is bent.

11. The device of claim 1, wherein the cable is coupled to a network analyzer.

12. A probe for measuring greater than an approximately 3 GHz signal from a trace positioned on a substrate having a first and a second opening to a ground, comprising:
   a) a connector;
   b) a cable coupled to the connector;
   c) a rectangular member having a first side and a second side, coupled to the connector, having a conductive element for contacting and measuring the signal from the trace;
   d) a first rigid prong, extending substantially perpendicular from the rectangular member second side, for positioning in the first opening; and,
   e) a second rigid prong, extending substantially perpendicular from the rectangular member second side, for positioning in the second opening.

13. The probe of claim 12, further comprises:
   a network analyzer, coupled to the cable, for generating a high frequency signal injected into the microwave transmission line.

14. An apparatus for measuring a high frequency signal, comprising:
   a) a connector;
   b) a coaxial cable coupled to the connector;
   c) a network analyzer, coupled to the coaxial cable, for analyzing the high frequency signal;
   d) a substrate having a first trace and a second trace, wherein the substrate includes a first and second opening to a ground;
   e) a low inductance rectangular member having a first side and second side, coupled to the connector, wherein the low inductance rectangular member includes
      1) a conductive element for contacting the first trace and the second trace, and
      2) a first and second rigid prong, extending substantially perpendicular from the second side, for positioning into the first and second opening, respectively.

15. The apparatus of claim 14, wherein the network analyzer generates a high frequency signal substantially greater than 3 GHz injected into the first and second trace.

* * * * *

UNITED STATES PATENT AND TRADEMARK OFFICE
CERTIFICATE OF CORRECTION

PATENT NO.   : 5,905,421
DATED        : May 18, 1999
INVENTOR(S)  : William Oldfield It is certified that error appears in the above-identified patent and that said Letters Patent is hereby corrected as shown below:

Column 5, line 60:  after "on" insert --the--

Signed and Sealed this

Twenty-third Day of November, 1999

Attest:

Q. TODD DICKINSON

*Attesting Officer*            *Acting Commissioner of Patents and Trademarks*